United States Patent [19]
Rochelo et al.

[11] Patent Number: 5,531,328
[45] Date of Patent: Jul. 2, 1996

[54] CONTAINER FOR ELECTRONIC CARD

[76] Inventors: Donald R. Rochelo, 66 Leona Dr., Pittsfield, Mass. 01201; Robert W. Jones, P.O. Box 8, Dalton, Mass. 01226

[21] Appl. No.: 326,686
[22] Filed: Oct. 20, 1994
[51] Int. Cl.$^6$ ................................................ B65D 85/30
[52] U.S. Cl. .............................. 206/706; 206/454
[58] Field of Search ........................ 206/328, 334, 206/449, 451, 453, 454, 308.1, 308.3, 307, 706

[56] References Cited

U.S. PATENT DOCUMENTS

| | | | |
|---|---|---|---|
| 4,593,813 | 6/1986 | Powel | 206/328 |
| 4,678,245 | 7/1987 | Fouassier | 206/308.1 X |
| 4,838,422 | 6/1989 | Gregerson | 206/308.1 |

*Primary Examiner*—Bryon P. Gehman
*Attorney, Agent, or Firm*—Kent I. Patashnick

[57] ABSTRACT

The present invention is a container for containing a PCM-CIA card, or an electronic card similar thereto. The container comprises a box that has a bottom portion for holding the card, and a cover portion that is rotatably connected with the bottom portion in order to fit over the bottom portion in the closed position. In the closed position, the cover and bottom portions form a box compartment. The bottom portion comprises opposite side walls that have flexible arms, wherein each arm has a clasp and a cam member, as a single unit and integral with each arm's distal end. A PCMCIA card fits within the area defined by the bottom portion's side walls. The area within which the PCMCIA card fits is slightly smaller than the area of the compartment in order to allow flex spaces for the arms to flex when a PCMCIA card has been fitted between the arms. The clasp and cam member on each arm enables both the arms to flex laterally when engaged by a PCMCIA card that is forced through the arms, and the automatic securing of the PCMCIA card when the PCMCIA card is fitted fully within the containing area, thereby enabling easy or automated loading of PCMCIA cards.

14 Claims, 9 Drawing Sheets

CONTAINER FOR ELECTRONIC CARD

FIELD OF THE INVENTION

The present invention relates to devices used to contain electronic cards. More specifically, the present invention relates to a container in which an electronic card can be contained, wherein the container enables protection of an electronic card from shock and vibration forces, enables easy or automated loading of an electronic card, and enables securing an electronic card within the container.

BACKGROUND

An important component to the electronic industry, and especially the computer industry, is the removable electronic circuit board—one type is currently termed a PCMCIA card (an acronym for personal computer memory card international association card). A PCMCIA card, or an electronic card similar thereto, generally provides special hardware or components (e.g., modem), or specific computer programs or applications usually set forth in non-volatile memory. A PCMCIA card plugs into a computer or other electronic device, generally via an adapter means, and enables the computer or electronic device to carry out specific applications. A PCMCIA card generally comprises an electronic circuit board contained within a protective housing that is adapted to enable the board to couple with a computer or electronic device. The housing provides a cover to prevent a person from touching the circuit board's delicate electronic components and circuitry, and to protect the circuit board from dust and moisture.

Needless to say, but a PCMCIA card, or any electronic card similar thereto, can be expensive in light of the card's electronics and programming. Due to the card's brittle board and fragile electronic components and circuitry thereon, the card should not be subjected to physical shock and injury. The PCMCIA card needs protection during shipping and storing. The PCMCIA card's housing is just not adequate by itself. Hence, a container is necessary for adequately packaging, shipping and storing the PCMCIA card safely and protectively. However, such a container must satisfy certain demands that include absorbance and protection against physical shock, jolts and vibrations, securing of the PCMCIA card within the container, and easy or automated loading of the PCMCIA card into the container.

Consequently, it is an objective of the present invention to provide a container for a PCMCIA card, or an electronic card similar thereto, that protects a PCMCIA card, or an electronic card similar thereto, from shock, jolts and vibrations, enables easy loading or automated loading of a PCMCIA card into the container, and provides means for securing the PCMCIA card therein. These and still further objectives will become apparent hereinafter.

SUMMARY OF THE INVENTION

The foregoing objectives and tasks of an appropriate PCMCIA card container are realized by providing a container that has means to absorb forces, means for securing the PCMCIA card within the container, and means for enabling PCMCIA packaging automation or easy loading.

The present invention comprises a box that comprises a base portion that has an area defined by an end wall and two opposite side walls. Each side wall comprises a flexible arm capable of absorbing shock and vibrational forces. A cover fits over the base portion. The cover has an area defined by an end wall and two opposite side walls that is a little larger than the area of the base portion. Thus, upon fitting the cover over the base, there is sufficient space between the lengths of the flexible arms and the respective length portions of the cover's side walls for the arms to flex laterally to absorb or counter shock and vibrational forces when a PCMCIA card is fitted between the flexible arms.

A PCMCIA card is secured releasably within the container by clasps. At the distal end of each flexible arm is a clasp. Upon fitting a PCMCIA card fully into the base portion, the arm clasps secure about the respective front edge sides of the PCMCIA card. Due to the flex of the arms, the clasps snap about the front edge sides. The box can also have other clasps, in the form of a clips or a clamps, on the base portion's end wall. The clips are adapted to clip or clamp releasably over the bottom and top sides of the PCMCIA card.

To enable easy loading or automated packaging of PCMCIA cards into the box, the distal end portions of the flexible arms form a channel opening into the bottom portion. The exterior portions of the distal ends are chamfered inwardly and slope toward the channel opening area. When a force applies to the chamfered distal ends, as when a PCMCIA card is forced to slide into the opened channel of the base portion and engages the chamfered distal ends, each arm flexes laterally to receive the PCMCIA card into the base portion area. In the preferred embodiment, the arm clasps comprises each arm's distal end. Thus, as soon as the PCMCIA card is forced fully into the bottom portion, the arms snap about the PCMCIA card's front edge sides and secure the card therein.

There are many advantages to the present invention. The flexible arms can absorb shock, jolts and vibrations when the PCMCIA card is fitted therebetween by being able to flex within the containing area of the base portion and the space between the side walls of the bottom and cover portions. Further, because of the arms' distal ends' clasps, the PCMCIA card is held in place—both when the container is in the closed position or the opened position. Thus, the PCMCIA card will not slide out of the box when opened. Rather, a person has to disengage the arm clasps in order to the remove the card. In this manner, the card cannot accidentally slide out and fall onto the floor, for example, and be damaged due to the fall.

Additionally, the flexible arms form a channel for receiving the PCMCIA into the bottom portion, while the distal ends form the channel opening. In combination with the chamfered distal ends and the flex of the arms, PCMCIA cards can be loaded via automation or easily slid into the bottom portion. As a PCMCIA card is guided and forced to the box's channel opening, the card engages the chamfered distal ends. When forced thereagainst, the arms are forced to flex laterally in order to receive the card. Further, to enhance automated or easy loading, due to the arms' flex, once fully fitted into the containing area, the clasps automatically engage or snap about the front edge sides of the PCMCIA card.

The arms' flex helps correct lateral displacement of the card as it is slid into the base portion. Thus, alignment errors occasionally inherent in automated packaging machines or manual loading can be minimized. Indeed, if the force does not properly align with the channel of the base portion, the arms flex to change the channel width and channel opening area.

BRIEF DESCRIPTION OF THE INVENTION

DETAILED DESCRIPTION OF THE INVENTION

Figure 1:
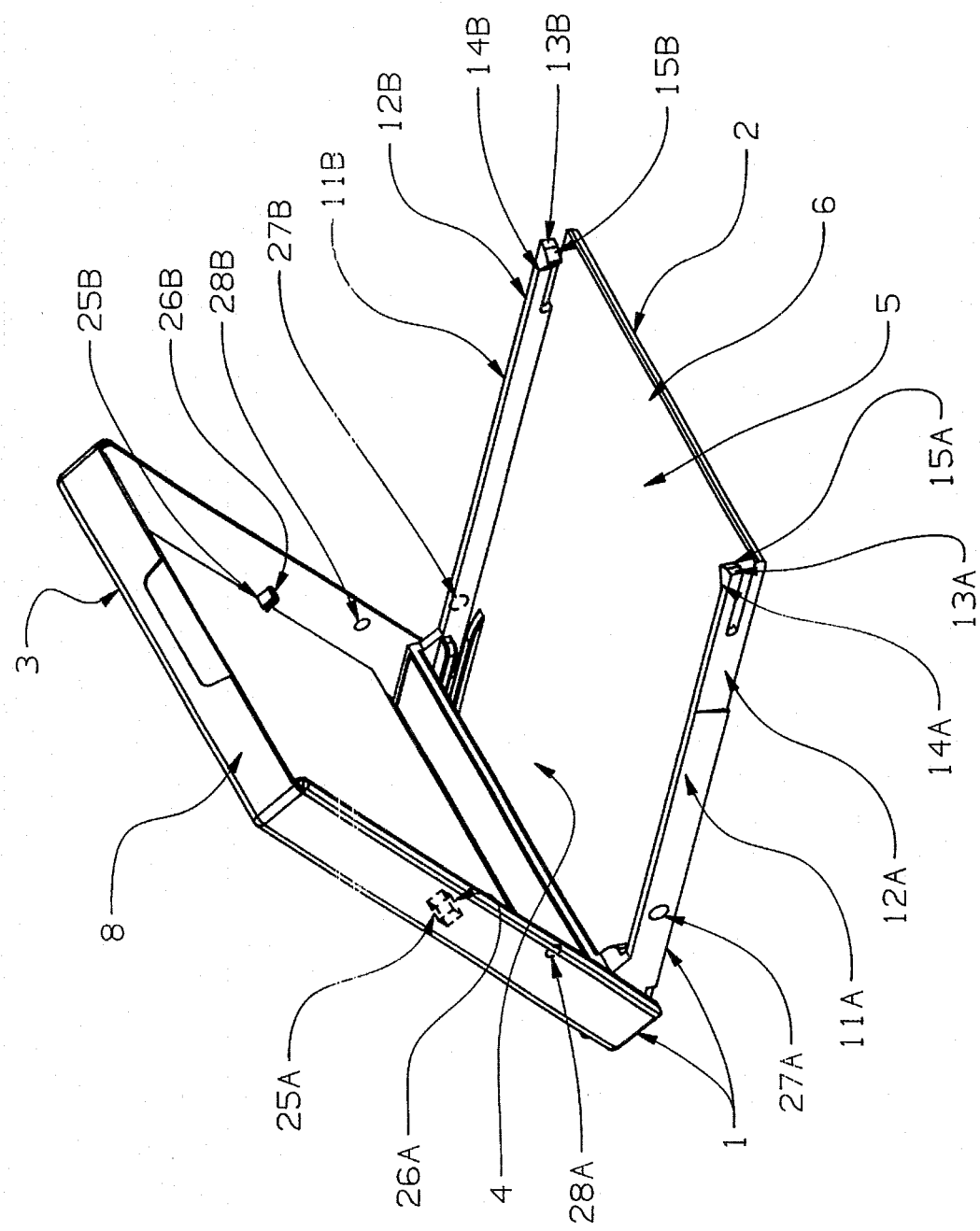
FIG. 1 is a perspective view of one embodiment of the PCMCIA card container, wherein the container is in the opened position.

An in depth description of the invention and the preferred embodiment is now in order. With reference to the drawings, like reference characters designate like or corresponding parts throughout the several views.

Figure 4:
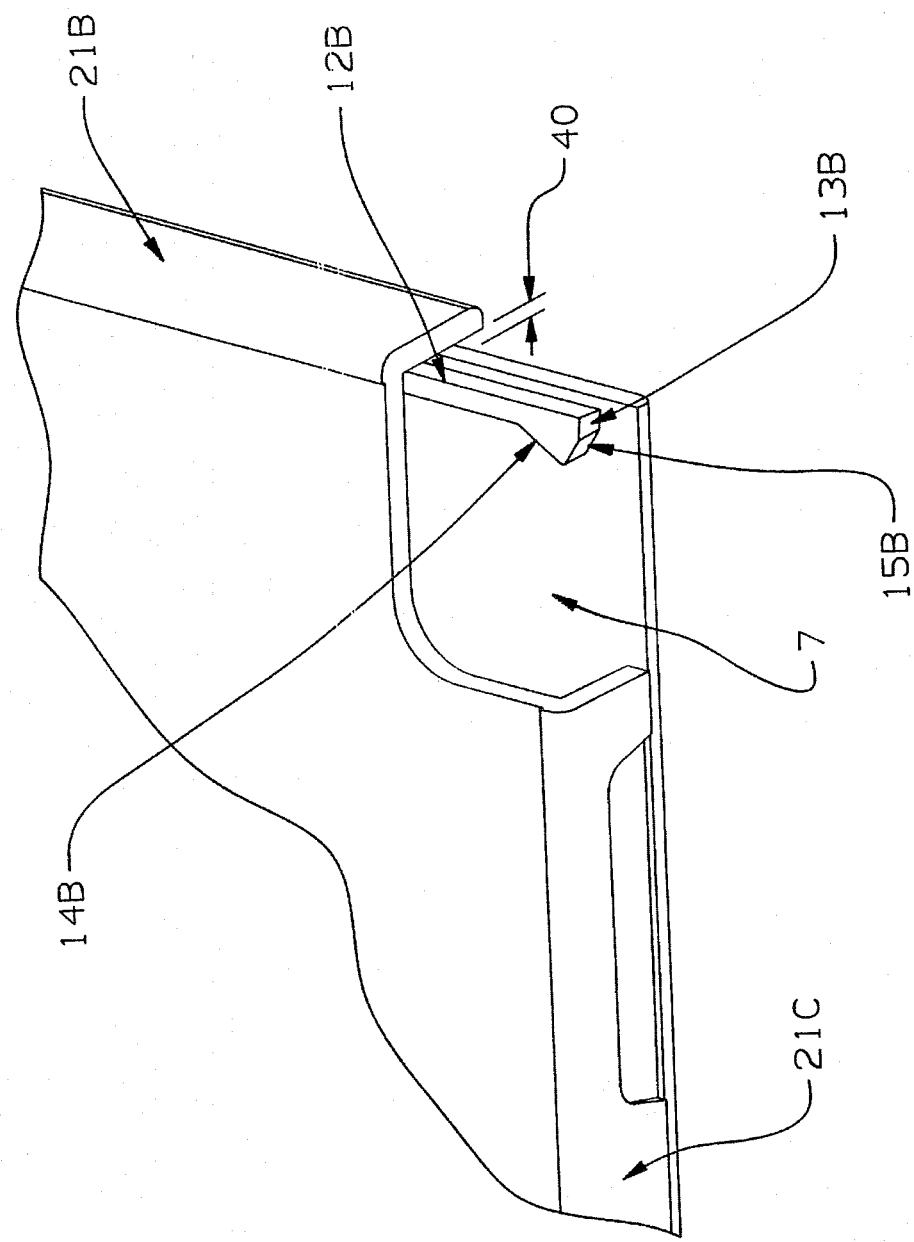
FIG. 4 is a perspective view of one embodiment of the PCMCIA card container, wherein the container is in the closed position.

Referring to FIG. 1, a perspective view of box 1 is shown in an opened position. Box 1 comprises bottom 2 and cover 3, rotatably connected together. Bottom 2 has containing area 4, channel 5, channel opening 6, and exterior surface 8. Cover 3 is adapted to fit over bottom 2 to form compartment 7, as best seen in FIG. 4.

Figure 8:
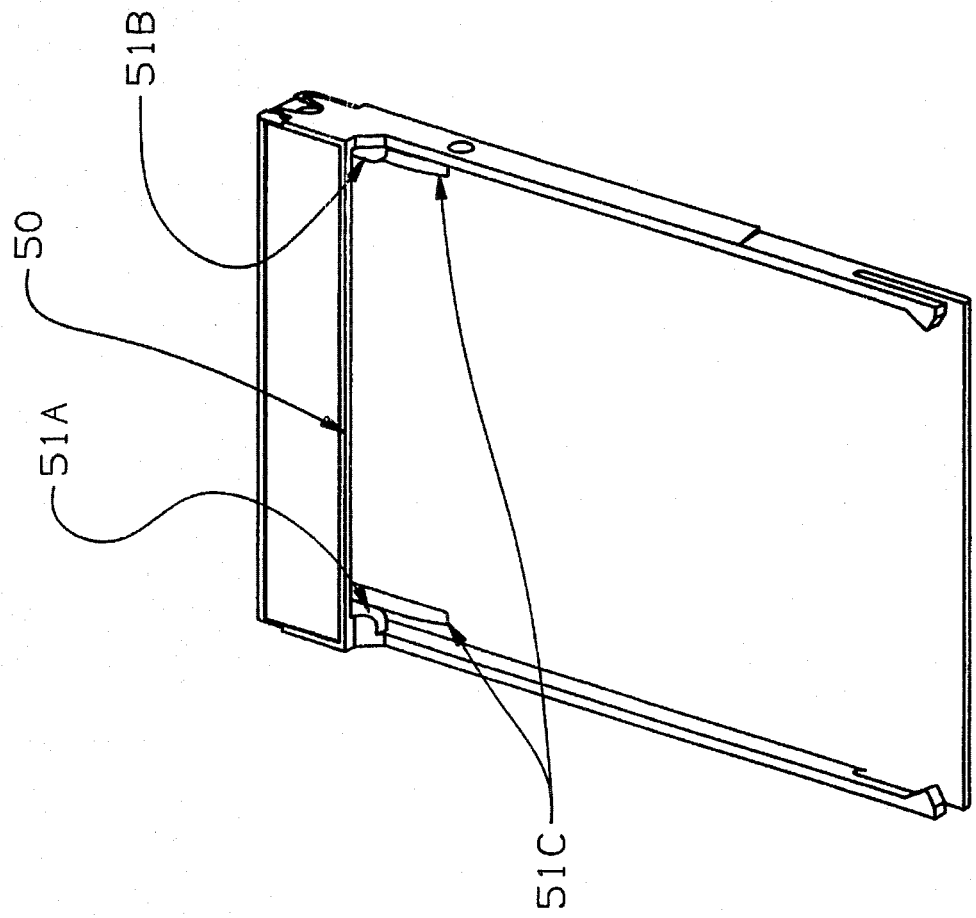
FIG. 8 is a perspective view of one embodiment of a PCMCIA card.

Referring to FIG. 8, a perspective view of PCMCIA card 30 is shown. Card 30 has a housing 31 that comprises front side 32a, back side 32b, top side 32c, bottom side 32d, and opposite lateral sides 32e and 32f. The electronic circuitry and components are contained within the housing 31, generally as an electronic board fitted therein. It is understood by persons skilled in the art that PCMCIA cards are not restricted to the embodiment shown. Rather, the embodiment shown is a representative embodiment for purposes of disclosing the preferred embodiment of the present invention and for purposes of explaining the invention. It is further understood by persons skilled in the art that the present invention can be adapted to contain different embodiments of PCMCIA cards, or electronic cards similar thereto.

Figure 5:
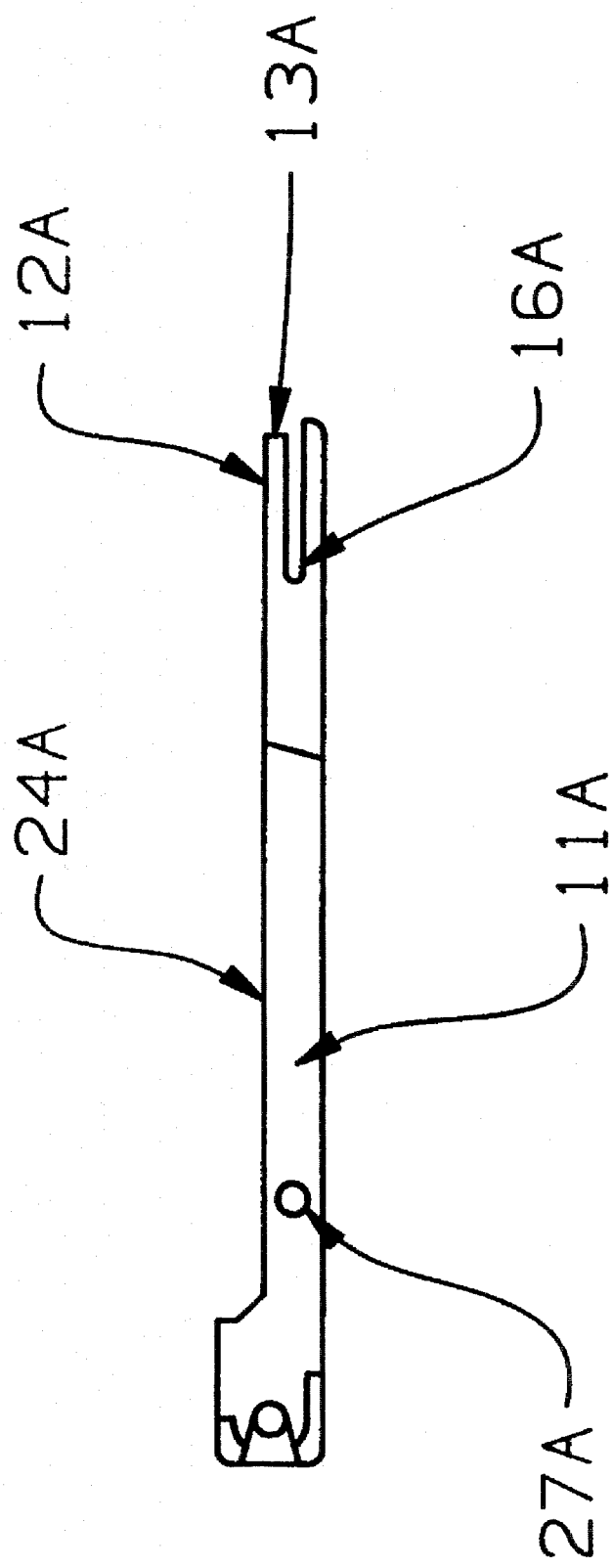
FIG. 5 is a side view of the bottom portion of the PCMCIA container.
Figure 6:
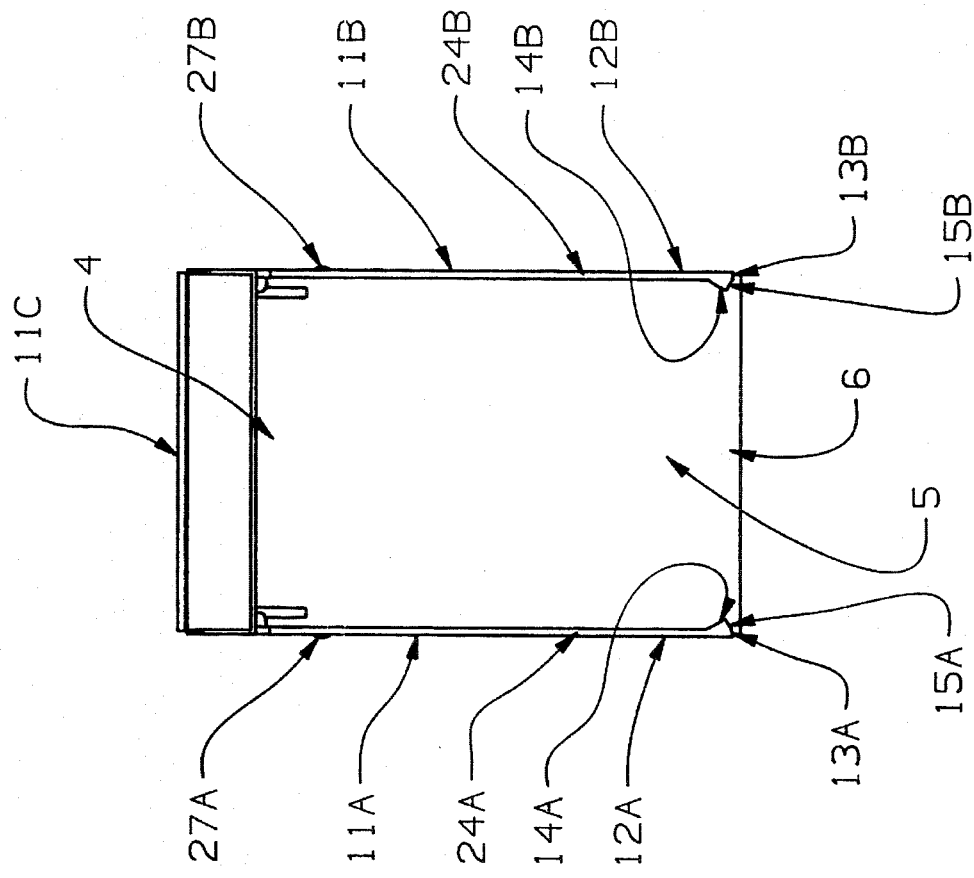
FIG. 6 is a top view of the bottom portion of the PCMCIA container.
Figure 7:
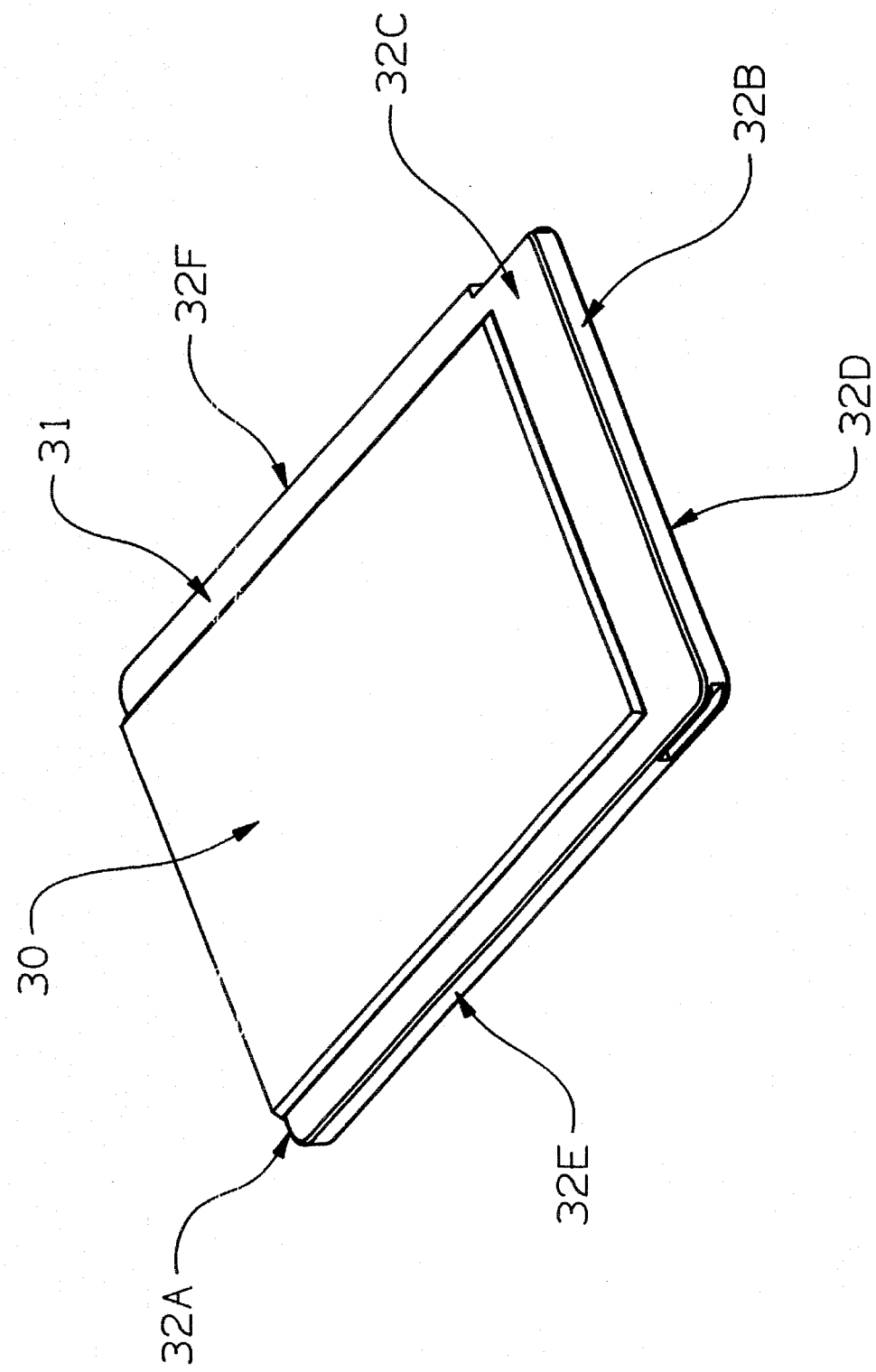
FIG. 7 is a perspective view of the bottom of the PCMCIA container.

Referring to FIG. 1, FIG. 6 and FIG. 7, bottom 2 comprises opposite side walls 11a and 11b, and end wall 11c. Side walls 11a and 11b comprise flexible arms 12a and 12b respectively. Although side walls 11a and 11b, in the preferred embodiment, also function as supporting means for arms 14a and 14b, it is understood by those skilled in the art that the supporting means are not limited or restricted to this embodiment. Rather, the means for supporting arms 14a and 14b in bottom 2 comprise means that secure or attach or connect or fix or hold, whether integrally or separably, arms 14a and 14b in bottom 2, and in a manner for arms 14a and 14b to flex. Flexible arms 12a and 12b comprise distal ends 13a and 13b respectively with clasps 14a and 14b respectively. As best demonstrated in FIG. 6 and FIG. 7, the exterior portion of the distal ends 13a and 13b have chamfered portions 15a and 15b. These chamfered portions slope inwardly toward channel opening 6. As shown in FIG. 5, bottom 2 has female joints 16a and 16b on the exterior surfaces of side walls 11a and 11b at a position close to end wall 11c. Clasps 14a and 14b are angled respective to the container's longitudinal axis to account for PCMCIA cards that do not fall within the width tolerance specifications. Additionally, the angle of clasps 14a and 14b function to enable arms 12a and 12b to flex and absorb shock and forces once PCMCIA card 30 is fitted into container area 4. Essentially, the slopes of the clasps 14a and 14b provide incline means, wherein PCMCIA side 32a engages and travels along the slopes' inclines to enable flex of arms 12a and 12b in order to absorb or counter shock, vibration and other forces. Further, the inclines or slopes of clasps 14a and 14b, in combination with the arms' flex, facilitate automated or easy loading because the arms force a PCMCIA card fully into the containing area via a snapping action. As PCMCIA card 30 is slid or pushed into containing area 4, the flex ensures continuous engagement of clasps 14a and 14b with sides 32e and 32f. When clasps 14a and 14b begin to engage side 32a of PCMCIA card 30, the arms' flex forces the respective edges of side 32a to move down the inclines of clasps 14a and 14b, thereby ensuring that PCMCIA card 30 is fully fitted into containing area 4. This important function is extremely useful where automated loading is utilized. Occasionally, because of automation alignment errors, imperfect loading alignment, uncalibrated machinery, and the like, a PCMCIA card may not be fully pushed or forced into containing area 4. Additionally, the loading cycle per PCMCIA card is enhanced because an automated loading machine can utilize this snapping and incline feature and not be required to push or force a PCMCIA card fully into containing area 4.

Figure 2:
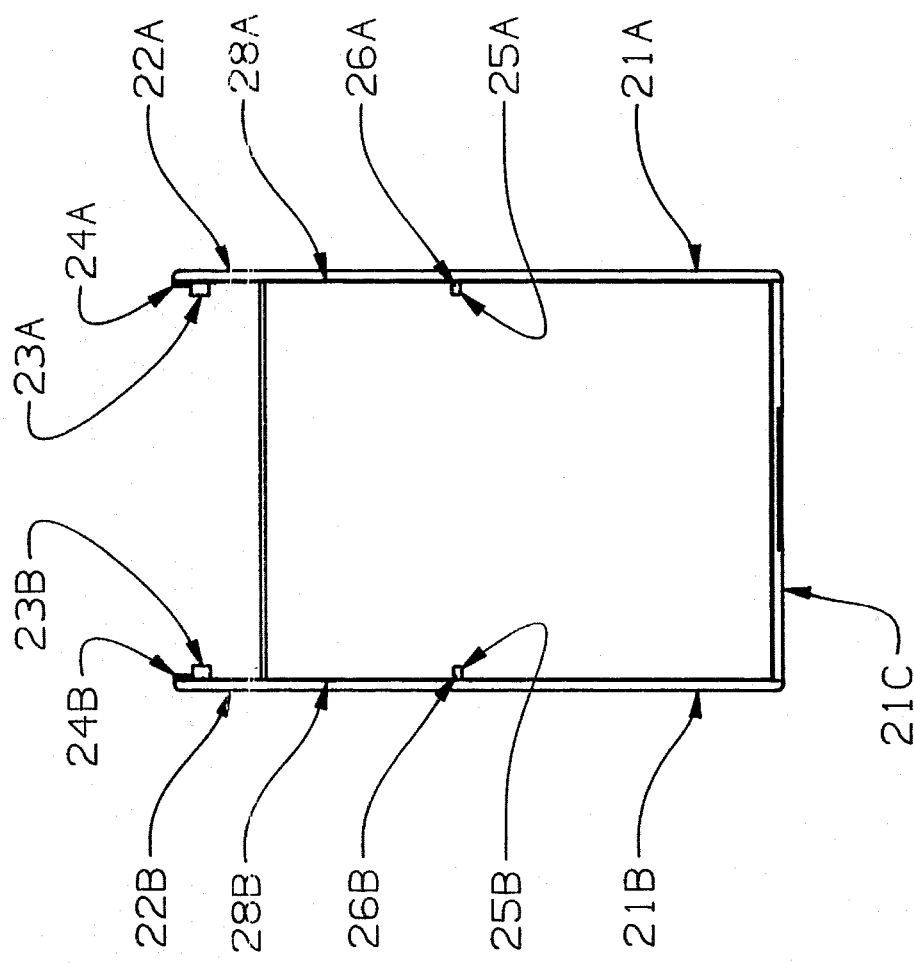
FIG. 2 is a top view of the cover portion of the PCMCIA container.
Figure 3:
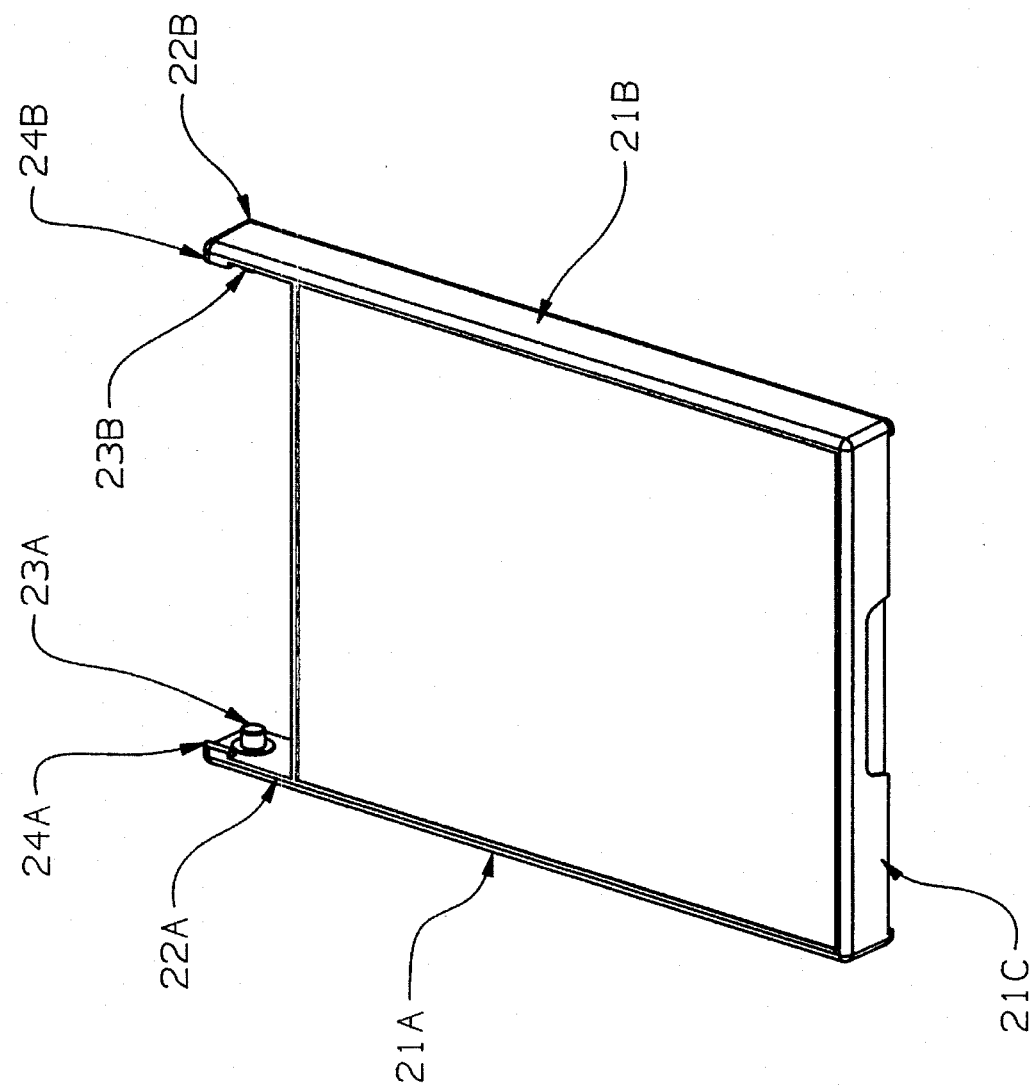
FIG. 3 is a bottom view of the cover portion of the PCMCIA container.

Referring to FIG. 1, FIG. 2 and FIG. 3, cover 3 comprises opposite side walls 21a and 21b, and end wall 21c. As shown in FIG. 2, side walls 21a and 21b extend longitudinally to form hinge arms 22a and 22b, with male joints 23a and 23b. Bottom 2 and cover 3 rotatably connect via fitting male joints 23a and 23b into female joints 16a and 16b. As best shown in FIG. 2 and FIG. 3, hinge arms 22a and 22b have catch ledges 24a and 24b. Catch ledges 24a and 24b function to restrict the rotation arc when cover 2 and bottom 3 are rotated relative to each other to an opened position. In the preferred embodiment, catch ledges 24a and 24b are flat and extend inwardly and perpendicularly to the longitudinal plane of cover 3, thereby restricting the rotation past 180°. In this manner, when bottom 2 and cover 3 are rotated to an opened position, portions of the exterior surface of bottom 2 engage catch ledges 24a and 24b, wherein the relative rotation of bottom 2 and cover 3 is limited. Consequently, by restricting the rotation arc, it is easier to load and unload a PCMCIA card into or out of container 1.

Referring to FIG. 2, vertical stops 25a and 25b are oppositely aligned along side walls 21a and 21b of cover 3. Stops 25a and 25b (with ends 26a and 26b) function to prevent bottom 2 from collapsing into cover 3. When in the closed position, the ends 26a and 26b engage portions of the top surfaces of side walls 21a and 21b at points A. And referring to FIG. 5, FIG. 6 and FIG. 7, when in the closed position, bottom 2 and cover 3 lock together via a male and female securing means. Male securing means members 27a and 27b are on side walls 21a and 21b of cover 3, while female securing means indents 28a and 28b are on side walls 11a and 11b of bottom 2. When rotated to the closed position, male securing means members 27a and 27b snap releasably into female securing means indents 28a and 28b, thereby locking bottom 2 and cover 3 together. As best shown in FIG. 4, when in the closed position, bottom 2 and cover 3 form compartment 7. Flex spaces 40 are respective to the areas between the length of arms 12a and 12b, and the respective lengths of side walls 21a and 21b of cover 3. In the preferred embodiment, the flex space distance respective to each arm and cover side wall is approximately between 1 millimeter and 5 millimeters.

To fit PCMCIA card 30 into bottom 2, card 30 is forced against distal ends 13a and 13b, wherein the edges of front sides 32a of card 30 engage chamfers 15a and 15b. Due to the flex of arms 12a and 12b, arms 12a and 12b flex laterally into spaces 40, thereby widening channel opening 6 to receive card 30. As card 30 slides through channel opening 6, distal ends 13a and 13b engage lateral sides 32e and 32f of cover 31 of card 30. In this manner, card 30 is guided through channel 5 into containing area 4 of bottom 2. Once fully into containing area 4, clasps 14a and 14b clasp about the edges of front side 32a of card 30. Similarly, when in the closed position and card 30 has been fitted into containing area 4, arms 12a and 12b can flex into spaces 40. Because clasps 14a and 14b hold card 30 within containing area 4, forces imparted to card 30 can be absorbed or countered due to the flex of arms 12a and 12b. Absorbing or countering such forces helps protect the delicate PCMCIA card.

Figure 9:
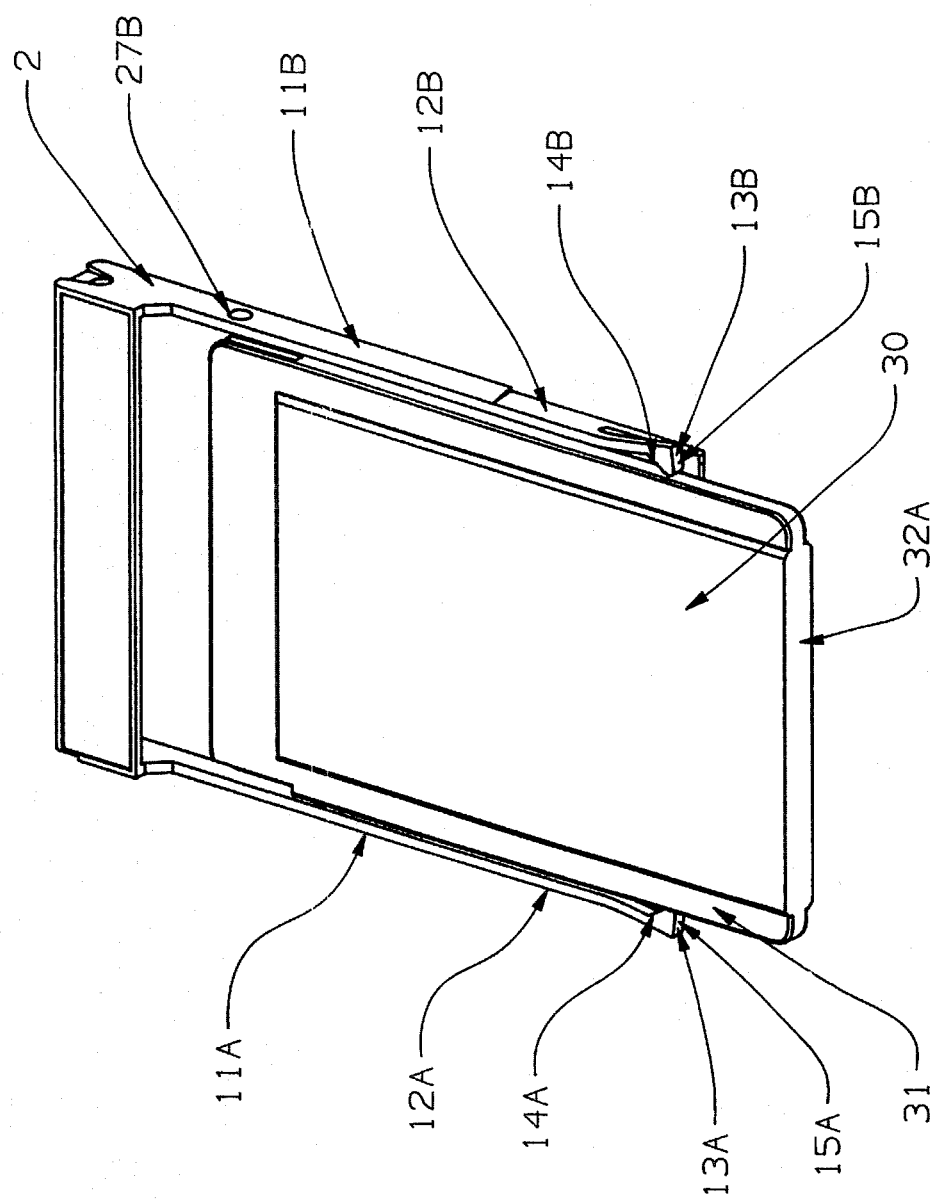
FIG. 9 is a perspective view of one embodiment of the bottom portion of the PCMCIA card container and a PCMCIA card fitted partially into the container.

In another embodiment of the present invention, as best shown in FIG. 9, clamps 50 are attached to end wall 11c of bottom 2. Each clamp 50 comprises upper lip 51a, bottom lip 51b, and slide 51c. When PCMCIA card 30 is forced into containing area 4, PCMCIA card 30 side 32d slides along and up slides 51c of each of the clamps 50, into the area defined by lips 51a and 51b of each of the clamps 50. Upper lips 51a and bottom lips 51b clip or clamp respectively about sides 32c and 32d of PCMCIA card 30 respectively in order to secure PCMCIA card 30 in bottom 2.

Referring to chamfers 15a and 15b, it is understood to those skilled in the art that the chamfers 15a and 15b are one type of an embodiment of cam member means. Consequently, the present invention is not restricted or limited to the particular cam member means embodiment shown. Rather, there is means on each of arms 12a and 12b for engaging with PCMCIA card 30 when PCMCIA card 30 is forced into channel opening 6 and into channel 5, wherein force is imparted to flex arms 12a and 12b laterally. It is within the scope of the present invention wherein PCMCIA card 30 engages cam member means members on arms 12a and 12b when slid into containing area 4. PCMCIA card 30 essentially functions as a sliding cam to impart force to arms 12a and 12b via cam member means members (e.g., chamfers 15a and 15b) in order for arms 12a and 12b to flex laterally. Or, in the embodiments shown, wherein the edges of side 32a of PCMCIA card 30 engages cam member means members to lever arms 12a and 12b about respective lever points of side walls 11a and 11b. It is further understood by those skilled in the art that the term cam member means members comprises members attached or connected to or integral with, or the like, arms 12a and 12b for directing or redirecting forces applied thereto by PCMCIA card 30 to flex arms 12a and 12b.

Referring to clasps 14a and 14b, it is understood to those skilled in the art that the clasps 14a and 14b are one type of an embodiment of clasping means. Consequently, the present invention is not restricted or limited to the particular clasping means embodiment shown. It is within the scope of the present invention wherein the clasping means engages in the manner of a clip or clamp the side or sides of PCMCIA card 30. As an example, in one type of such an embodiment, the clasping means could be along the sides of walls 11a and 11b, or the sides of arms 12a and 12b. In this example, the clasping means would function as clips or clamps, and therefore engage portions of sides 32a and 32b of PCMCIA card 30.

Referring to hinge arms 22a and 22b, and their respective joint means 23a and 23b, and 16a and 16b, respectively, it is understood to those skilled in the art that these elements are one form or embodiment to hinge the base 2 and cover 3 rotatably together. Consequently, the present invention is not restricted or limited to the particular rotatable connection means embodiment shown. It is within the scope of the present invention wherein the rotatable connection means hinges the base 2 and cover 3 rotatably together in a clam-shell fashion.

Referring to male and female securing means 27a and 27b, and 28a and 28b, respectively, it is understood to those skilled in the art that these elements are one form or embodiment for securing the base 2 and the cover 3 in the closed position. Consequently, the present invention is not restricted or limited to the particular securing means embodiment shown. It is within the scope of the present invention wherein the securing means enables the releasable engagement of the base 2 and the cover 3 together.

Referring to vertical stops 25a and 25b, it is understood to those skilled in the art that these elements are one form or embodiment for preventing cover 3 from interfering with flexible arms 12a and 12b when container 1 is in the closed position. Consequently, the present invention is not restricted or limited to the particular stop means embodiment shown. It is within the scope of the present invention wherein the stop means prevents base 2 from collapsing into cover 3, wherein the means comprises the engaging cover 3 wherein the roof of cover 3 is above the horizontal plane of arms 12a and 12b.

While the preferred embodiment of the invention has been disclosed and described, further modifications of the invention herein disclosed will occur to those skilled in the respective art and all such modifications are deemed to be within the scope of the invention as defined by the appended claims.

What is claimed is:

1. An electronic card box for containing an electronic card that comprises:

a. a bottom portion having an area in which an electronic card can fit, said area defined by an end wall and two opposite side walls, an arm extended longitudinally therefrom and said arm enabled to flex laterally away from the other sidewall;

b. a cover portion adapted to fit over said bottom portion comprising a cover area that has an end wall and two opposite side walls, wherein, when said cover portion is fitted ever said bottom portion, there is sufficient space between each arm and its adjacent cover portion side wait for each arm to flex laterally into said space; and, c. stop means for preventing said cover portion from contacting said arms in order to enable said arms to flex laterally when said cover portion is fitted over said bottom portion.

2. An electronic card box as claimed in claim 1, wherein a portion of each arm comprises means for clasping an edge of an electronic card in order to secure the card within the area of said bottom portion in which the electronic card can fit.

3. An electronic card box as claimed in claim 2, wherein each clasping means comprises means that enables the lateral flexing of said arm in order to receive an electronic card into said bottom portion area.

4. An electronic card box as claimed in claim 3 that comprises means for rotatably connecting the bottom portion and the cover portion together in order to enable rotating between an opened position and a closed position.

5. An electronic card box as claimed in claim 4, wherein said bottom portion end wall comprises a clip for securing an electronic card.

6. An electronic card box as claimed in claim 5 that comprises releasable locking means for locking said bottom portion and said cover portion together when said cover portion is fitted over said bottom portion.

7. A container for an electronic card that comprises a container area in which an electronic card can fit;

wherein said container area is defined by two opposite side walls and an end wall, each side wall comprising an arm extended longitudinally therefrom and said arm enabled to flex laterally away from the other sidewall, wherein each arm has an end portion;

wherein the end portion of each arm comprises a clasp member, said clasp member having a chamfered portion exterior to said container area adapted to enable the lateral flexing of its arm when engaged by an edge of an electronic card that is against said chamfered portion, each clasp member further having a sloped portion interior to and extended into said container area adapted to engage an edge of an electronic card that is against said clasp member sloped portion when the electronic card is fitted into said container area.

8. A container for an electronic card as claimed in claim 7, wherein said end portions of said arms define a channel opening into said container area;

wherein said chamfered portion of each of said clasp members is chamfered as a slant toward said channel opening in order to enable the lateral flexing of the respective arm when engaged by an edge of an electronic card; and, wherein said sloped portion of each of said clasp members is sloped toward said channel opening in order to enable adapting the engagement of said clasp member to a respective edge of an electronic card to the width of the electronic card.

9. A container for an electronic card as claimed in claim 7, wherein said container comprises a base portion and a cover portion, said base portion comprising said container area;

wherein said cover portion comprises two opposite side walls and an end wall, said cover portion adapted to fit about said base portion in order to form a closed compartment when fitted thereabout.

10. A container for an electronic card as claimed in claim 16, that comprises means for hingably connecting the base portion and the cover portion together in order to enable rotation between an opened position and a closed position, and means for releasably locking the base portion and the cover portion together in the closed position.

11. A container for an electronic card that comprises a container area in which an electronic card can fit;

wherein said container area is defined by two opposite side walls and an end wall, each side wall comprising an arm extended longitudinally therefrom and said arm enabled to flex laterally away from the other sidewall;

wherein each arm comprises a clasping member for clasping an edge of an electronic card in order to secure the card within the area of said container area, said clasping member having flex enabling means for flexing laterally its arm away from the other side wall when engaged by an edge of an electronic card that is against said flex enabling means in order to receive the electronic card into said container area.

12. A container for an electronic card, as claimed in claim 11, wherein said flex enabling means comprises a chamfered portion of said clasping member exterior to said container area.

13. A container for an electronic card, as claimed in claim 12, wherein said clasping member comprises a portion interior to said container area that is angled into said container area.

14. A container for an electronic card, as claimed in claim 8, wherein said container comprises a base portion and a cover portion, said base portion comprising said container area;

wherein said cover portion comprises two opposite side walls and an end wall said cover portion adapted to fit about said base portion in order to form a closed compartment when fitted thereabout, said base portion and cover portion hingably connected together in order to enable rotation between an opened position and a closed position, and means for releaseably locking the base portion and the cover portion together in the closed position.

* * * * *